(12) United States Patent
Zhu et al.

(10) Patent No.: US 12,146,906 B2
(45) Date of Patent: Nov. 19, 2024

(54) TFT PANEL AND TEST METHOD

(71) Applicant: IRAY TECHNOLOGY COMPANY LIMITED, Shanghai (CN)

(72) Inventors: Chongyu Zhu, Shanghai (CN); Libo Jin, Shanghai (CN); Huan Yue, Shanghai (CN)

(73) Assignee: IRAY TECHNOLOGY COMPANY LIMITED, Shanghai (CN)

( * ) Notice: Subject to any disclaimer, the term of this patent is extended or adjusted under 35 U.S.C. 154(b) by 351 days.

(21) Appl. No.: 17/430,716

(22) PCT Filed: Oct. 18, 2019

(86) PCT No.: PCT/CN2019/111829
§ 371 (c)(1),
(2) Date: Aug. 13, 2021

(87) PCT Pub. No.: WO2020/164249
PCT Pub. Date: Aug. 20, 2020

(65) Prior Publication Data
US 2022/0146565 A1 May 12, 2022

(30) Foreign Application Priority Data
Feb. 13, 2019 (CN) .......................... 201910112908.4

(51) Int. Cl.
*G01R 31/26* (2020.01)
*H01L 27/12* (2006.01)

(52) U.S. Cl.
CPC ........ *G01R 31/2621* (2013.01); *H01L 27/124* (2013.01)

(58) Field of Classification Search
CPC ............ G01R 31/2621; G01R 31/2829; G01R 31/2844; H01L 27/124
See application file for complete search history.

(56) References Cited

U.S. PATENT DOCUMENTS

2001/0045997 A1 11/2001 Kim
2010/0053487 A1* 3/2010 Wu .................. G09G 3/006
349/42

(Continued)

FOREIGN PATENT DOCUMENTS

CN 1731205 A 2/2006
CN 103513454 A 1/2014

(Continued)

*Primary Examiner* — Neel D Shah
*Assistant Examiner* — Adam S Clarke
(74) *Attorney, Agent, or Firm* — IPRTOP LLC

(57) ABSTRACT

A thin-film transistor (TFT) panel and a test method are disclosed. The TFT panel includes: m×n bonding pads, where m and n are both natural numbers greater than or equal to 1, and the m×n bonding pads are arranged correspondingly to and electrically connected to TFT units in a TFT active area; a TFT test area including m drive pads, n test pads, and m×n TFT devices, where the m×n TFT devices are divided into n groups, each of which includes m TFT devices. the m TFT devices in each group corresponding to and are electrically connected to the m drive pads and m bonding pads respectively, and the m TFT devices in each group are electrically connected to a same test pad of the n test pads. The m×n bonding pads that were originally bonded by pressure once are tested in m sessions.

9 Claims, 2 Drawing Sheets

(56) References Cited

U.S. PATENT DOCUMENTS

| | | | | |
|---|---|---|---|---|
| 2010/0244026 A1* | 9/2010 | Chang | ............... | H01L 22/32 |
| | | | | 257/E23.01 |
| 2011/0279128 A1* | 11/2011 | Von Staudt | ............ | G09G 3/006 |
| | | | | 324/538 |
| 2018/0329544 A1* | 11/2018 | Yeh | ............... | G06F 3/04164 |
| 2019/0378770 A1* | 12/2019 | Iguchi | ............... | H01L 27/156 |
| 2021/0181916 A1* | 6/2021 | Kwon | ............... | H10K 71/70 |

FOREIGN PATENT DOCUMENTS

| | | |
|---|---|---|
| CN | 104656292 A | 5/2015 |
| CN | 105372888 A | 3/2016 |
| CN | 109920799 A | 6/2019 |
| KR | 20160066238 A | 6/2016 |

* cited by examiner

TFT PANEL AND TEST METHOD

CROSS REFERENCE TO RELATED APPLICATION

This is a Sect. 371 National Stage of PCT International Application No. PCT/CN2019/111829, filed on Oct. 18, 2019, which claims the benefit of priority to Chinese Patent Application No. CN 2019101129084, entitled "TFT PANEL AND TEST METHOD", filed with CNIPA on Feb. 13, 2019, the disclosure of which is incorporated herein by reference in its entirety.

FIELD OF TECHNOLOGY

The present invention relates to the field of flat panel detectors, and relates to a thin-film transistor (TFT) panel and a test method.

BACKGROUND

Digital Radiography (DR) is a new X-ray photography technology developed in the 1990s. With its remarkable advantages such as faster imaging, more convenient operations and higher imaging resolution, DR has predominated in digital X-ray photography technologies, and has been recognized by clinical institutions and imaging experts all over the world.

Generally, flat panel detectors are a type of detectors that convert X-ray energy into electrical signals, by using a semiconductor technology, and generate X-ray images. With the development of society and the progress of science and technology, X-ray flat panel detectors play a vital role in both the field of medical imaging and the field of industrial flaw detection, and a TFT panel is one of core components of a X-ray flat panel detector. During manufacturing of the flat panel detector, the TFT panel needs to be tested in advance so as to avoid the waste of material and production capacity in subsequent manufacturing process caused by defects of the TFT panel.

Currently, a TFT panel in an X-ray flat panel detector before being manufactured is usually tested by using a test method with a thin film probe. That is, the thin film probe is bonded by pressure to a bonding pad on the TFT panel to implement electrical connection, and the test is carried out with an external circuit driving and reading the TFT panel. However, due to the fact that there are usually a large number of bonding pads on a TFT panel with a relatively small pitch the test process has a high requirement for the precision of test devices and test jigs, and for the cleanliness of the test environment. Also, material costs of related test devices are high, and the test success rate is low, which consequently further increases the material costs of the test devices and the production capacity costs brought by the low test success rate.

Therefore, it is really necessary to provide a novel TFT panel and a test method to reduce the material costs required by the test and improve the test success rate, so as to reduce production capacity loss and the costs.

SUMMARY

In view of the disadvantages in the prior art, an objective of the present invention is to provide a TFT panel and a test method to resolve problems of high requirements for a test device and a test jig, low test success rate, and high material costs and production capacity costs during the test before manufacturing the TFT panel To achieve the foregoing objective and other related objectives, the present invention provides a TFT panel. The TFT panel comprises:

m×n bonding pads, where m and n are both natural numbers greater than or equal to 1, and the m×n bonding pads are arranged to correspond to TFT units in a TFT active area and are electrically connected to the TFT units; and a TFT test area, comprising m drive pads, n test pads, and m×n TFT devices, where the m×n TFT devices are divided into n groups, each group comprises m TFT devices, the m TFT devices in each group correspond to and are electrically connected to the m drive pads and m bonding pads respectively, and the m TFT devices in each group are electrically connected to a same test pad of the n test pads.

Optionally, the bonding pad comprises one or a combination of a read-side bonding pad located in the TFT panel, and a drive-side bonding pad located in the TFT panel.

Optionally, m and n comprise natural numbers causing m+n to be less than m×n.

Optionally, the range of the ratio of a pitch between the adjacent drive pads to a pitch between the adjacent bonding pads comprise a range of from 5 to 20, and the range of the ratio of a pitch between the adjacent test pads to a pitch between the adjacent bonding pads comprise a range of from 5 to 20.

Optionally, the drive pads comprise millimeter-level drive pads, and the test pads comprise millimeter-level test pads.

Optionally, the TFT devices and the TFT units are made of the same materials.

Optionally, the drive pads, the test pads, and the bonding pads are made of the same materials.

The present invention further provides a test method for a TFT panel, comprising:

providing any one of the foregoing TFT panels; and performing m tests respectively through the m drive pads and the n test pads to obtain information about the m×n bonding pads, where the n TFT devices electrically connected to one of the drive pads are turned on during each test, and information about the n bonding pads electrically connected to the n turned-on TFT devices is obtained through the n test pads.

Optionally, a test jig adopted in the test method for a TFT panel comprises one or a combination of a thin film probe and a point probe.

Optionally, the bonding pad comprises one or a combination of a read-side bonding pad located in the TFT panel and a drive-side bonding pad located in the TFT panel.

As described above, in the TFT panel and the test method of the present invention, the TFT test area comprising m drive pads, n test pads, and m×n TFT devices is integrated on the TFT panel, so that the number of pads required for testing (m+n) is less than the number of bonding pads in the TFT panel (m×n). Therefore, the pitch between pads required for testing is greater than the pitch between bonding pads in the TFT panel. When testing the TFT panel, testing of the m×n bonding pads which were originally bonded once is carried out in m sessions, so that one high-precision test can be substituted by m low-precision tests, which lowers requirements for the test devices and the test jigs, improves the test success rate, and reduces material costs and production capacity costs.

REFERENCE NUMERALS

| | |
|---|---|
| 100, 110 | Bonding pad |
| 200, 210 | TFT test area |
| 201, 211 | Drive pad |
| 202, 212 | Test pad |
| 203, 213 | TFT device |

DETAILED DESCRIPTION

The following describes implementations of the present invention by using specific embodiments. A person skilled in the art may easily understand other advantages and effects of the present invention from the content disclosed in this specification. The present invention may also be implemented or applied through other different specific implementations. Various details in this specification may also be modified or changed based on different viewpoints and applications without departing from the spirit of the present invention.

Figure 1:
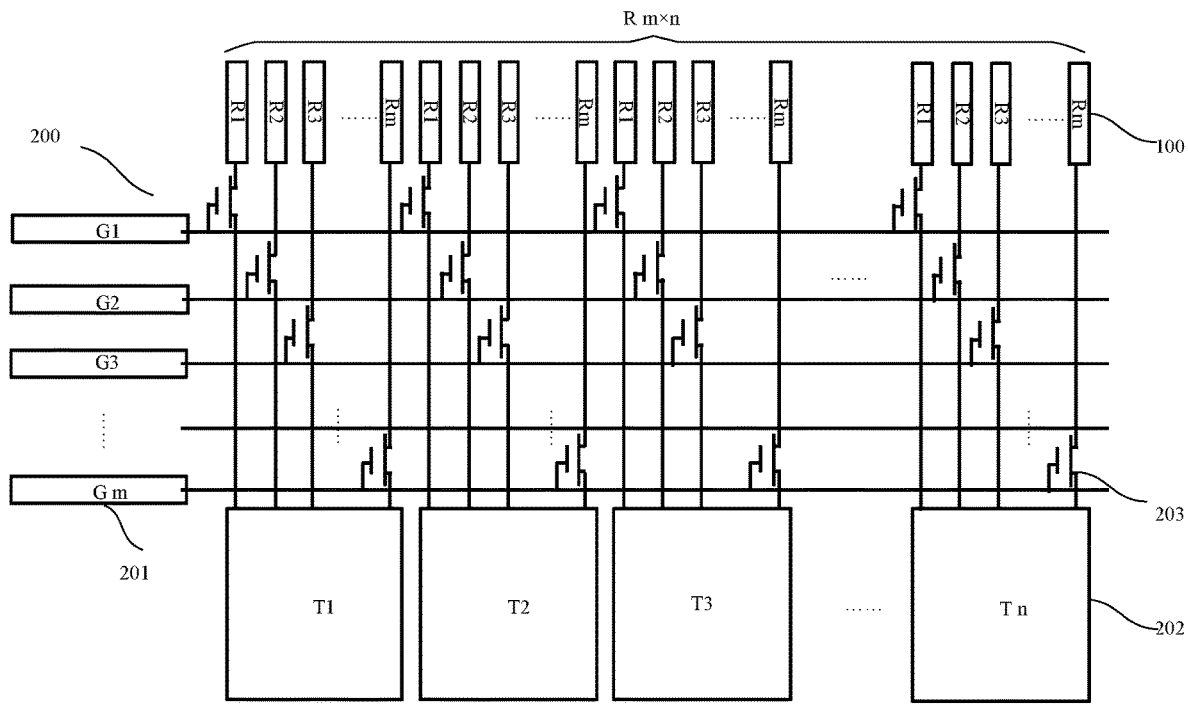
FIG. 1 is a schematic structural diagram of a TFT panel according to Embodiment 1.
Figure 2:
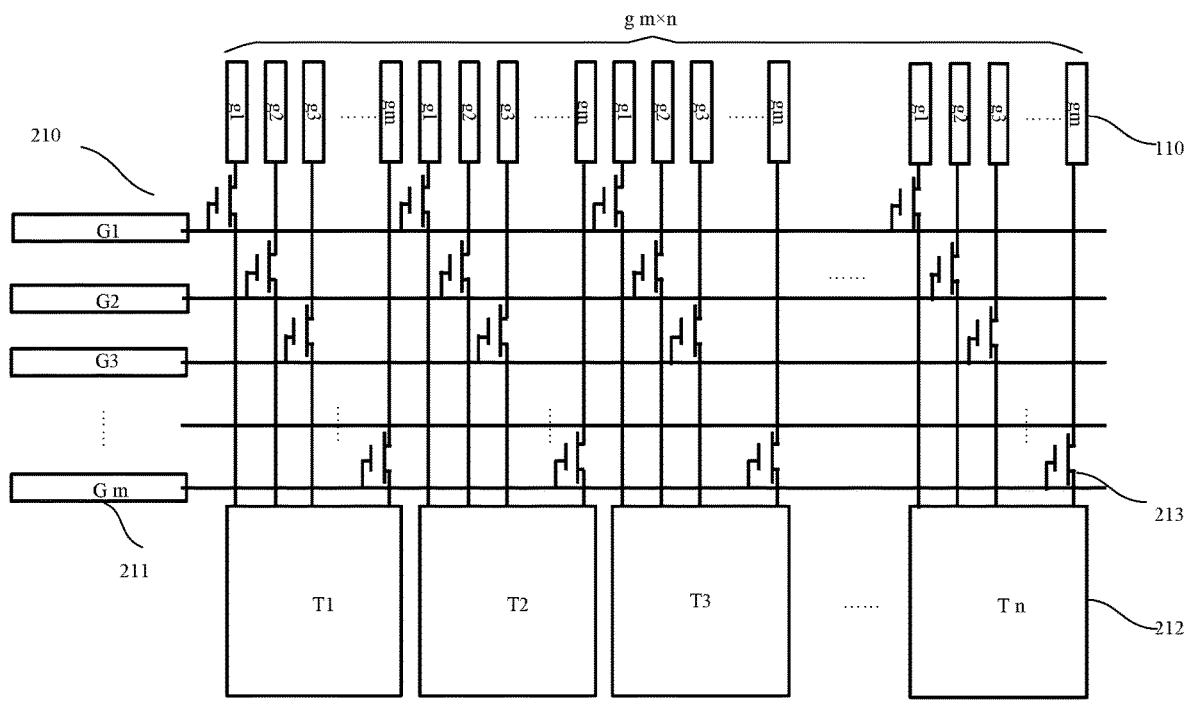
FIG. 2 is a schematic structural diagram of a TFT panel according to Embodiment 2.
Figure 3:
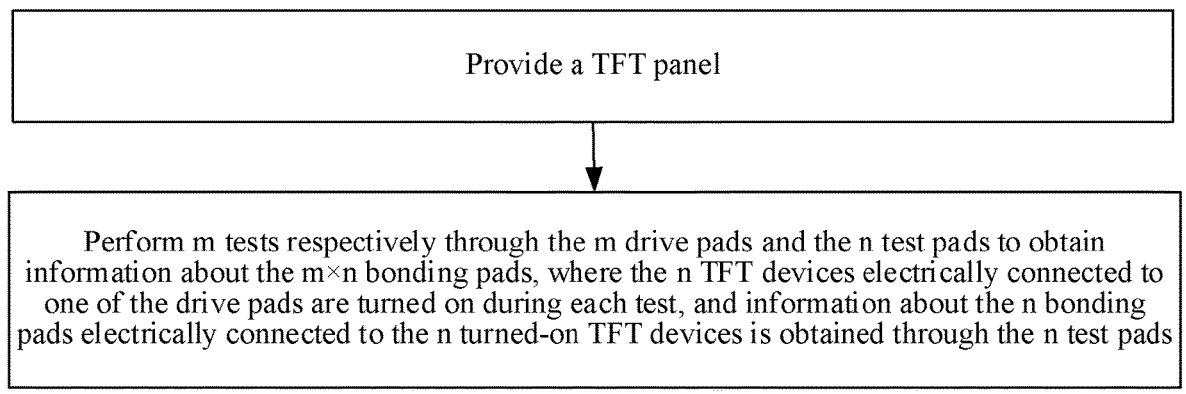
FIG. 3 is a schematic flowchart of a test method for a TFT panel according to Embodiment 3.

Reference is made to FIG. 1 to FIG. 3. It should be noted that the drawings provided in this embodiment only exemplify the basic idea of the present invention. Therefore, only the components related to the present invention are shown in the drawings, and are not drawn according to the quantities, shapes, and sizes of the components during actual implementation. During actual implementation, the types, quantities, and proportions of the components may be randomly changed, and the layout of the components may be more complex.

Embodiment 1

This embodiment provides a TFT panel, comprising:
m×n bonding pads, where m and n are both natural numbers greater than or equal to 1, and the m×n bonding pads are arranged to correspond to TFT units in a TFT active area and electrically connected to the TFT units; and
a TFT test area, comprising m drive pads, n test pads, and m×n TFT devices, where the m×n TFT devices are divided into n groups, each group comprises m TFT devices, the m TFT devices in each group correspond to and are electrically connected to the m drive pads and m bonding pads respectively, and the m TFT devices in each group are electrically connected to a same test pad of the n test pads.

In the TFT panel in this embodiment, the TFT test area comprising m drive pads, n test pads, and m×n TFT devices is integrated on the TFT panel, so that the pitch between pads required for testing is increased, which reduces requirements for the test devices and the test jigs, improves the test success rate, and reduces material costs and production capacity costs.

As shown in FIG. 1, this embodiment provides a TFT panel, comprising m×n bonding pads 100 and a TFT test area 200, where m and n are both natural numbers greater than or equal to 1, and the m×n bonding pads 100 are read-side bonding pads located in the TFT panel; that is, the bonding pads 100 comprise n groups of R1~Rm and are arranged to correspond to TFT units (not shown) in a TFT active area. The TFT test area 200 comprises m drive pads 201, namely, G1~Gm, n test pads 202, namely, T1~Tn, and m×n TFT devices 203. The m×n TFT devices 203 are divided into n groups, each of which comprises the m TFT devices 203. The m TFT devices 203 in each group correspond to and are electrically connected to the m drive pads 201 and m bonding pads 100 respectively. The m TFT devices 203 in each group are electrically connected to a same test pad 202 of the n test pads 202.

Specifically, the n groups of R1~Rm bonding pads 100 are configured to be bonded to subsequently required circuit boards (such as FPC) and functional devices (such as IC) on the TFT panel, so as to drive and read information of the TFT panel, and may be further configured to test the TFT panel before the TFT panel being manufactured When the bonding pads 100 are configured to test the TFT panel before it being put into service, the high precision, large number and small pitch of the bonding pads 100 proposes higher requirement on precision of test devices and test jigs, which increases material cost and results in a low test success rate. Therefore, this embodiment provides additional drive pads 201 G1~Gm, additional test pads 202 T1~Tn, and m×n additional TFT devices 203 on the TFT panel, so that both m and n are far less than the number m×n of the bonding pads 100. Therefore, when testing the TFT panel before it is put into service, in conventional solutions, m×n high-precision probes need to be bonded to the bonding pads 100. In this embodiment, however, all information about the TFT panel can be obtained simply by pressing and bonding m+n low-precision probes to the low-precision drive pads 201 G1~Gm and the low-precision test pads 202 T1~Tn. This structure reduces the precision of the drive pads 201 and the test pads 202, decreases the total number of the test pads and increases the pitch between the test pads, thereby greatly reducing requirements for the test devices and test jigs, improving the test success rate and reducing costs.

As a further embodiment of this embodiment, m and n comprise natural numbers causing m+n to be less than m×n, and values of m and n may comprise natural numbers greater than or equal to 3. Larger values of m and n can embody higher superiority of this embodiment, and the specific values of m and n are not limited herein.

As a further embodiment of this embodiment, the range of the ratio of a pitch between the adjacent drive pads 201 to a pitch between the adjacent bonding pads 100 comprises a range of from 5 to 20, and the range of the ratio of a pitch between the adjacent test pads 202 to a pitch between the adjacent bonding pads 100 comprises a range of from 5 to 20.

Specifically, since the number m of the drive pads 201 and the number n of the test pads 202 are both far less than the number m×n of the bonding pads 100, the total number of the drive pads 201 and the test pads 202 is reduced and the pitch is increased with a given area, which may greatly reduce requirements for the test device and the test jig, may improve the success rate of test, and lower costs. The ratio of a pitch between the adjacent drive pads 201 to a pitch between the adjacent bonding pads 100 may comprise 5, 10, 15 and 20. Similarly, the ratio of a pitch between the adjacent test pads 202 to a pitch between the adjacent bonding pads 100 may comprise 5, 10, 15 and 20, but is not limited thereto.

As a further embodiment of this embodiment, the drive pads 201 comprise millimeter-level drive pads, and the test pads 202 comprise millimeter-level test pads.

Specifically, in the prior art, the pitch between the adjacent bonding pads 100 generally ranges from 50 μm to 100 μm, such as 60 μm. In this embodiment, since the number m of the drive pads 201 and the number n of the test pads 202 are both far less than the number m×n of the bonding pads 100, the sizes of the drive pads 201 and the test pads 202 may be made tens of times as large as that of the bonding pads 100, and may reach the millimeter level while the number may be correspondingly reduced by tens of times, thereby further reducing requirements for the test device and the test jig, improving the test success rate, and lowering costs.

As a further embodiment of this embodiment, the TFT devices 203 and the TFT units are made of the same materials. The drive pads 201, the test pads 202, and the bonding pads 100 are made of the same materials.

Specifically, when the TFT devices 203 and the TFT units are made of the same materials, the preparations of TFT devices 203 and the TFT unit may be performed simultaneously to reduce process steps and costs. Similarly, the drive pads 201, the test pads 202, and the bonding pads 100 may also be made of the same material, but are not limited thereto, and specific types and materials of the TFT devices 203, the TFT units, the drive pads 201, the test pads 202, and the bonding pads 100 may be selected as required and are not limited herein.

Embodiment 2

As shown in FIG. 2, to further explain the solutions of the present invention, this embodiment further provides another TFT panel. Compared with Embodiment 1, this embodiment is different in that the bonding pads 110 in this embodiment are drive-side bonding pads located in the TFT panel, and only requires converting the high-precision read-side bonding pads in Embodiment 1 into the drive-side bonding pads in the TFT panel. The bonding pads have functions changed from reading to driving, and are still controlled by the low-precision drive pads 211.

Specifically, in this embodiment, the TFT panel comprises the m×n bonding pads 110 and a TFT test area 210, where m and n are both natural numbers greater than or equal to 1, and the m×n bonding pads 110 are drive-side bonding pads located in the TFT panel, that is, the bonding pads 110 comprise n groups of g1~gm and are arranged correspondingly to TFT units (not shown) in the TFT active area. The TFT test area 210 comprises m drive pads 211, namely, G1~Gm, n test pads 212, namely, T1~Tn, and m×n TFT devices 213. The m×n TFT devices 213 are divided into n groups, each of which comprises the m TFT devices 213. Them TFT devices 213 in each group correspond to and are electrically connected to the m drive pads 211 and m bonding pads 110 respectively. Them TFT devices 213 in each group are electrically connected to a same test pad 212 of then test pads 212. The materials and distributions of the drive pads 211, the test pads 212, and the TFT devices 213 are identical to those of Embodiment 1, and are not described in detail herein again.

As a further embodiment of this embodiment, the bonding pad may alternatively comprise a combination of a read-side bonding pad located in the TFT panel and a drive-side bonding pad located in the TFT panel.

Specifically, FIG. 1 and FIG. 2 may be combined, that is, some of the bonding pads may adopt the read-side bonding pads located in the TFT panel and the rest of the bonding pads may adopt drive-side bonding pads located in the TFT panel may be combined, to further make it more convenient to test the TFT panel. The allocation ratio may be freely selected and is not limited herein.

Embodiment 3

As shown in FIG. 3, this embodiment provides a test method for a TFT panel, comprising:
providing any one of the foregoing TFT panels;
performing m tests respectively through the m drive pads and the n test pads to obtain information about the m×n bonding pads, where the n TFT devices electrically connected to one of the drive pads are turned on during each test, and information about the n bonding pads electrically connected to the n turned-on TFT devices is obtained through the n test pads.

Specifically, in this embodiment, the TFT test area comprising m drive pads, n test pads, and m×n TFT devices is integrated on the TFT panel, so that the number m+n of pads required for testing is less than the number m×n of bonding pads in the TFT panel. Therefore, the pitch between pads required for testing is greater than the pitch between bonding pads in the TFT panel. When testing the TFT panel, the testing of the m×n bonding pads which were originally bonded once are carried out in m sessions, so that one high-precision test can be substituted by m low-precision tests, which reduces requirements for the test devices and the test jigs, improves the test success rate, and reduces material costs and production capacity costs.

As a further embodiment of this embodiment, the test jigs adopted in the test method for the TFT panel comprise one or a combination of a thin film probe and a point probe.

Specifically, due to low precision, small total number and large pitch of the m drive pads and the n test pads, requirements on the test devices and test jigs may be greatly reduced, so that one or a combination of a thin film probe and a point probe may be used for testing, which improves the test success rate and reduces costs. When the thin film probe is adopted, the thin film probe only needs to be bonded to the drive pads and the test pads once, and all information about the TFT panel may be then obtained simply through program control. When the point probe is adopted, the test costs may be further reduced. Definitely, the test may alternatively be performed by adopting a test method combining the thin film probe and the point probe as required.

As a further embodiment of this embodiment, the bonding pad comprises one or a combination of a read-side bonding pad located in the TFT panel and a drive-side bonding pad located in the TFT panel.

Specifically, when the bonding pads adopt read-side bonding pads in the TFT panel, a function of the bonding pads is to read information in the TFT panel. When the bonding pads adopt drive-side bonding pads in the TFT panel, a function of the bonding pads is to drive the TFT units in the TFT panel. However, both the read-side bonding pads and the drive-side bonding pads are controlled by the drive pads. Definitely, the bonding pads may alternatively comprise a combination of a read-side bonding pad located in the TFT panel and a drive-side bonding pad located in the TFT panel.

The following provides an example of a specific test procedure. It should be noted that the TFT devices and the TFT units in the present invention are all turned on at a high level, and the test jigs include a thin film probe, but is not limited thereto. The specific test procedure is as follows:
S1: Press the probe down to achieve electrical connections with the low-precision drive pads and the low-precision test pads, with a total of m+n contact points;

S2: G1 provides a high level, so that all the TFT devices connected on G1 are turned on; and meanwhile the remaining low-precision test pads provide a low level, and all the corresponding TFT devices remain off;

S3: Read signals on T1~Tn to obtain information about a first group of n high-precision bonding pad corresponding to the TFT device turned on by G1;

S4: G2 provides a high level, so that all the connected TFT devices on G2 are turned on; and meanwhile the remaining low-precision test pads provide a low level, and the corresponding TFT devices all remain off.

S5: Read the signals on T1~Tn to obtain information about a second group of n high-precision bonding pad corresponding to the TFT device turned on by G2;

S6: Turn on G3-Gm one by one according to the above steps, to obtain information about all the m groups of n bonding pads, namely, all the information corresponding to the m×n high-precision bonding pads.

It should be noted that the foregoing steps are not limited thereto. For example, steps S4 and S5 may precede steps S2 and S3. This is not limited herein. In this embodiment, during testing, the testing of the m×n high-precision bonding pads which were originally bonded once are carried out in m sessions, so that one high-precision test can be substituted by m low-precision tests, and the m low-precision tests can be implemented without re-bonding by pressure and therefore can be done simply by program control. When the testing ends, the TFT test area may be removed or kept, which is not limited herein.

In summary, in the TFT panel and the test method of the present invention, the TFT test area comprising m drive pads, n test pads, and m×n TFT devices is integrated on the TFT panel, so that the number m+n of pads required for testing is less than the number m×n of bonding pads in the TFT panel. Therefore, the pitch between pads required for testing is greater than the pitch between bonding pads in the TFT panel. When testing the TFT panel, the testing of the m×n bonding pads which were originally bonded once are carried out in m sessions, so that a high-precision test can be substituted by m low-precision tests, which reduces requirements for the test device, improves the test success rate, and reduces material costs and production capacity costs. Therefore, the present invention effectively overcomes various shortcomings in the prior art, and has a high value in industrial use.

The foregoing embodiments merely exemplify the principles and effects of the present invention, but are not intended to limit the present invention. Any person skilled in the art may make modifications or changes on the foregoing embodiments without departing from the spirit and scope of the present invention. Therefore, all equivalent modifications or changes made by a person of ordinary skill in the art without departing from the spirit and technical idea of the present invention shall be covered by the claims of the present invention.

What is claimed is:

1. A thin-film transistor (TFT) panel, comprising:
    m×n bonding pads, wherein m and n are both natural numbers greater than or equal to 1, and the m×n bonding pads are arranged correspondingly to and electrically connected to TFT units in a TFT active area; and
    a TFT test area, comprising m drive pads, n test pads, and m×n TFT devices, wherein the m×n TFT devices are divided into n groups, each group comprises m TFT devices, the m TFT devices in each group correspond to and are electrically connected to the m drive pads and m bonding pads respectively, and the m TFT devices in each group are electrically connected to a same test pad of the n test pads;
    wherein m and n comprise natural numbers causing m+n to be less than m×n;
    wherein the range of the ratio of a pitch between the adjacent drive pads to a pitch between the adjacent bonding pads comprises a range of from 5 to 20, and the range of the ratio of a pitch between the adjacent test pads to a pitch between the adjacent bonding pads comprises a range of from 5 to 20.

2. The TFT panel as in claim 1, wherein the bonding pad comprises one or a combination of a read-side bonding pad located in the TFT panel and a drive-side bonding pad located in the TFT panel.

3. The TFT panel as in claim 1, wherein the drive pads comprise millimeter-level drive pads, and the test pads comprise millimeter-level test pads.

4. The TFT panel as in claim 1, wherein the TFT devices and the TFT units are made of the same materials.

5. The TFT panel as in claim 1, wherein the drive pads, the test pads, and the bonding pads are made of the same materials.

6. A test method for a TFT panel, comprising:
    providing the TFT panel comprising:
        m×n bonding pads, wherein m and n are both natural numbers greater than or equal to 1, and the m×n bonding pads are arranged correspondingly to and electrically connected to TFT units in a TFT active area; and
        a TFT test area, comprising m drive pads, n test pads, and m×n TFT devices, wherein the m×n TFT devices are divided into n groups, each group comprises m TFT devices, the m TFT devices in each group correspond to and are electrically connected to the m drive pads and m bonding pads respectively, and the m TFT devices in each group are electrically connected to a same test pad of the n test pads; and
    performing m tests respectively through the m drive pads and the n test pads to obtain information about the m×n bonding pads, wherein the n TFT devices electrically connected to one of the drive pads are turned on during each test, and information about the n bonding pads electrically connected to the n turned-on TFT devices is obtained through the n test pads;
    wherein m and n comprise natural numbers causing m+n to be less than m×n;
    wherein the range of the ratio of a pitch between the adjacent drive pads to a pitch between the adjacent bonding pads comprises a range of from 5 to 20, and the range of the ratio of a pitch between the adjacent test pads to a pitch between the adjacent bonding pads comprises a range of from 5 to 20.

7. The test method for a TFT panel as in claim 6, wherein a test jig adopted in the test method for a TFT panel comprises one or a combination of a thin film probe and a point probe.

8. The test method for a TFT panel as in claim 6, wherein the bonding pad comprises one or a combination of a read-side bonding pad located in the TFT panel and a drive-side bonding pad located in the TFT panel.

9. The test method for a TFT panel as in claim 6, wherein m and are natural numbers greater than or equal to 3.

* * * * *